US008410788B2

(12) United States Patent
Hartrampf et al.

(10) Patent No.: US 8,410,788 B2
(45) Date of Patent: Apr. 2, 2013

(54) METHOD FOR DIAGNOSING AN ELECTRONIC DISPLAY DEVICE

(75) Inventors: Ralf Hartrampf, Wagenfeld (DE); Ludger Rake, Diepholz (DE); Andreas Giefer, Lemforde (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 369 days.

(21) Appl. No.: 12/745,073

(22) PCT Filed: Dec. 4, 2008

(86) PCT No.: PCT/DE2008/050037
§ 371 (c)(1),
(2), (4) Date: May 27, 2010

(87) PCT Pub. No.: WO2009/080018
PCT Pub. Date: Jul. 2, 2009

(65) Prior Publication Data
US 2010/0301876 A1 Dec. 2, 2010

(30) Foreign Application Priority Data
Dec. 20, 2007 (DE) ......................... 10 2007 062 510

(51) Int. Cl.
*G01R 31/02* (2006.01)

(52) U.S. Cl. ....................................................... 324/537

(58) Field of Classification Search .................. 324/537
See application file for complete search history.

(56) References Cited

U.S. PATENT DOCUMENTS

| | | | | |
|---|---|---|---|---|
| 6,147,617 | A * | 11/2000 | Kim | 340/664 |
| 6,649,903 | B2 | 11/2003 | Couillaud et al. | |
| 6,710,548 | B2 * | 3/2004 | Kimura | 315/169.3 |
| 2002/0014851 | A1 | 2/2002 | Tai et al. | |
| 2003/0222672 | A1 | 12/2003 | Winer | |
| 2008/0224966 | A1 * | 9/2008 | Cok et al. | 345/82 |

FOREIGN PATENT DOCUMENTS

| | | | |
|---|---|---|---|
| EP | 1 231 592 | A2 | 8/2002 |
| KR | 10 2005 0 003 073 | A | 1/2005 |
| KR | 10 2006 0 073 688 | A | 6/2006 |

* cited by examiner

*Primary Examiner* — Thomas Valone
(74) *Attorney, Agent, or Firm* — Davis & Bujold, PLLC

(57) ABSTRACT

A method of diagnosing an electronic display device (1) having a screen (3) and a graphics memory (2) in which image data (14), of an image displayed or to be displayed on the screen (3), are one of stored or changed. A measured value (15) characterizes a current consumption or the change in current consumption of the screen (3) or display device (1) while a reference value (16) characterizes the current consumption or the change in current consumption of the screen (3) or display device (1) on the basis of the image data (14) or the change in image data (14). The method compares the reference value (16) to the measured value (15) to determine any malfunction or error in the electronic display device (1).

15 Claims, 4 Drawing Sheets

METHOD FOR DIAGNOSING AN ELECTRONIC DISPLAY DEVICE

This application is a National Stage completion of PCT/DE2008/050037 filed Dec. 4, 2008, which claims priority from German patent application serial no. 10 2007 062 510.5 filed Dec. 20, 2007.

FIELD OF THE INVENTION

The invention relates to a method for diagnosing an electronic display device having a screen and a graphics memory, in which image data of an image displayed or to be displayed on the screen are stored or changed. Further, the invention relates to a device for implementing the method.

BACKGROUND OF THE INVENTION

With the display devices on the market today that utilize organic light-emitting diodes (OLED), the displayed image can be diagnosed by reading out the graphics memory. This means that it can be recognized as an error if the image data of an image, which are transmitted via a data line to the display device, were not stored properly in the memory. Errors can be diagnosed by comparing the image content that was transmitted with the image content that is read out, and appropriate measures can be initiated. This would not be detected, however, with an error display caused by the design of the OLED driver in the region between the graphics memory and the OLED screen.

SUMMARY OF THE INVENTION

Proceeding from this prior art, the object of the invention is to create a possibility for diagnosing an electronic display device, thereby enabling the detection of a faulty on-screen display of image data stored in the graphics memory.

In the method, according to the invention, for diagnosing an electronic display device having a screen and a graphics memory, in which image data of an image displayed or to be displayed on the screen are stored and/or changed, a value characterizing the current consumption or the change in current consumption of the screen or display device is measured, and a reference value characterizing the current consumption or the change in current consumption of the screen or display device is determined on the basis of the image data or the change in image data, and is compared to the measured value.

Every pixel has a certain current consumption depending on its operating mode, which is determined by its color and/or brightness, for example. If the display device is monochromatic (e.g. black-white), the current consumption of each pixel is dependent only on the brightness selected, and/or on whether it is turned on or off. Since the image data include information about which pixel should be activated, the image data can also be used to determine which pixel causes or should cause which current consumption. Therefore, by adding up the current consumption determined for each pixel, the total current consumption of all pixels for an image can be determined. If, furthermore, the additional current consumption of other electronic components of the display device and/or the screen is known, this additional current consumption can be taken into consideration as offset, and can be added to the total current consumption of all pixels. It is therefore possible to determine the current consumption for the screen and/or display device that occurs or would have to occur when a certain image is displayed. If the current consumption that was determined does not match—within specified tolerances—the current consumption that was measured, then there is an error in the display. Depending on the comparison, a state signal is preferably generated, wherein the state signal contains information, for example on whether an error is present in the display.

The screen includes, in particular, a plurality of electrical light-emitting means, wherein at least one electrical light-emitting means is assigned to each pixel, and/or each pixel is formed by at least one electrical light-emitting means. However, it is also possible for each pixel to include a plurality, e.g. three, electrical light-emitting means that radiate or can radiate light of different colors in particular. The electrical light-emitting means are preferably light-emitting diodes. In particular, the electrical light-emitting means, or at least a portion thereof, are formed as organic light-emitting diodes (OLED).

The graphics memory is preferably a memory that is writable and/or readable; in particular the graphics memory is a random access memory (RAM).

The current consumption or the change in current consumption is preferably measured using a shunt. As an alternative, the current consumption or the change in current consumption can be measured using an inductance, whose magnetic field, which is proportional to the current consumption, is detected using a magnetic field-sensitive sensor.

The screen and/or display device are/is preferably connected between a ground wire and a supply line which is used to supply the screen and/or display device with current. In this case, the current consumption or the change in current consumption is measured e.g. in the supply line or the ground wire.

The display device is preferably used to display characters, thereby making it possible to use the method according to the invention to check whether the character to be displayed is actually displayed. If the aim is to be able to display and check different characters, they must result in different current consumptions if the result is to be unambiguous. For the case in which a plurality of characters would result in an identical current consumption, a certain number of pixels of a concealed screen region can be turned on for one of the characters (i.e. a non-visible auxiliary pattern is switched on). It is therefore possible to distinguish these characters by their different current consumption even though their visible regions induce or would induce an identical current consumption. Since the number of pixels that were switched on additionaly is not visible to the user since the region of the screen is concealed, the optical impression made by the affected character does not change.

The number of pixels in the auxiliary pattern is equal, in particular, to a value of a quotient which has been rounded up to a whole number, the dividend of which corresponds to the number of pixels in the screen, and the divisor of the quotient is equal to a power having base two, wherein the exponent of the power corresponds to the resolution of the measurement system, in bits in particular.

An alternative method for distinguishing between different characters that result in an identical current consumption is to divide one of the characters into at least two image segments. For example, at least two image segments can be assigned e.g. to a character to be displayed by the screen, a first one of which forms the image, the image data of which are stored in the graphics memory. It is therefore possible to check a image segment, and to load the remaining image data for the character into the graphics memory in order to display it in entirety. Preferably, the image segments are selected such that their current consumptions differ from an image that was displayed previously (and that will be overwritten). This stepwise loading and reloading of image data takes place so quickly, in particular, that it is not visible to the eye of an observer. Instead, it appears to the observer that all pixels are displayed simultaneously. Furthermore, a displayed image can be deleted before a new image is loaded e.g. to monitor the decreasing current consumption.

If a character is loaded into the graphics memory in a plurality of steps, a current difference can also be determined that occurs when switching from one step to a subsequent step. If the display device functions correctly, the current difference that is measured corresponds to a current difference that was calculated and that is determined on the basis of the image data that differ in the two steps.

The invention furthermore relates to a device that includes an electronic display device having a screen and a graphics memory, in which image data of an image displayed or to be displayed on the screen are stored or changed, or can be stored or changed, a current-measuring device, using which a value characterizing the current consumption or the change in current consumption of the screen or display device is measured or can be measured, and an evaluation device, using which a reference value characterizing the current consumption or the change in current consumption of the screen or display device is determined on the basis of the image data or the change in image data, and is compared to, or can be compared to, the measured value. This device is used in particular to implement the method according to the invention and can be developed according to all of the embodiments named in this context.

The method according to the invention and/or the device according to the invention are/is preferably used to diagnose or check the display device of a selector lever mechanism of a motor vehicle. A display device of this type displays e.g. the currently-engaged gear of a transmission of a motor vehicle.

A correct display can be diagnosed as correct by measuring the current consumption that is characteristic of every displayed image, or by measuring the change in current consumption caused by a change in the image data. The current can be measured using a shunt or inductance, whose magnetic field is proportional to the current consumption, is detected using a magnetic field-sensitive sensor such as a Hall element. According to the application, the current can be measured in the supply line or the ground wire.

If the number of pixels happens to be identical, a certain number of pixels can be used as a diagnostic cluster by a concealed region of the screen. In particular, to identify the image, these pixels can be switched on or off for additional current uptake. The size of the cluster in pixels (n) is preferably dependent on the size of the screen in pixels (p) and on the resolution of the measurement system in bits (b): n=p/2^b (n is the rounded-up whole number).

An advantage of the invention is the expanded error-diagnosing capability of display devices of this type in regards to the possibilities of influence due to an error in the driver IC of an OLED display device between the graphics memory and the OLED screen. In this case, the display device is diagnosed by measuring the current.

BRIEF DESCRIPTION OF THE DRAWINGS

The invention is described below using preferred embodiments, with reference to the drawings. They show.

DETAILED DESCRIPTION OF THE PREFERRED EMBODIMENTS

Figure 1:
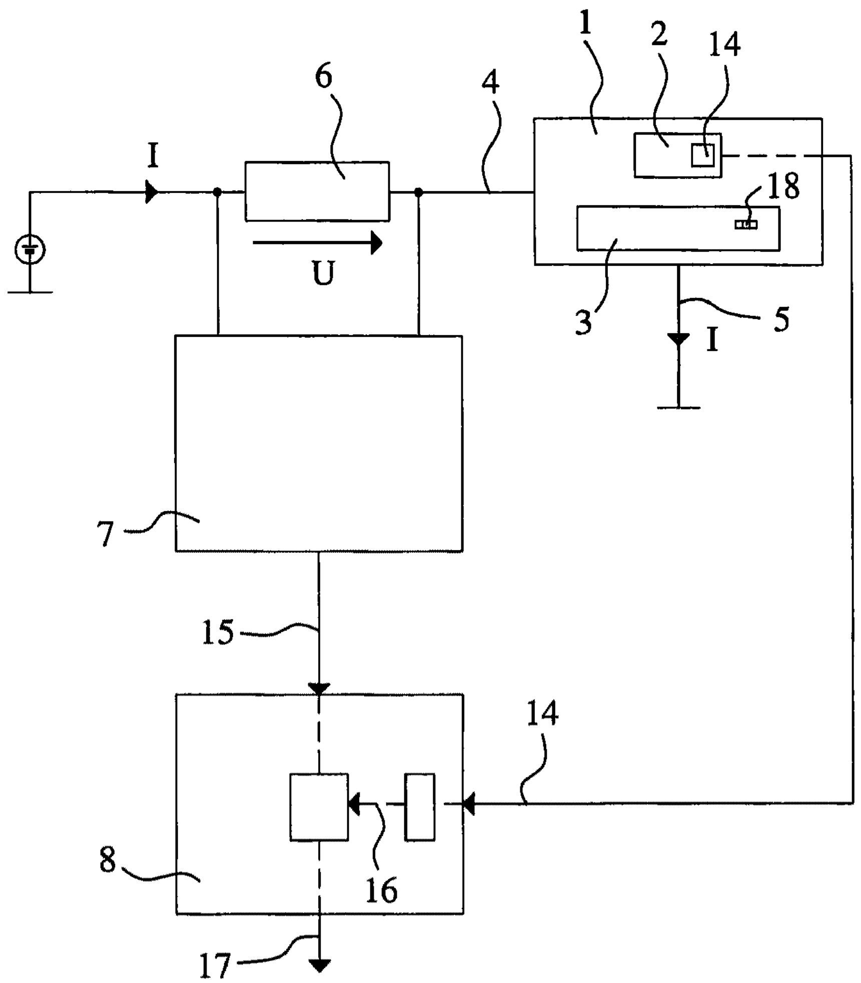
FIG. 1 a schematic block diagram of a display device having a diagnostic circuit according to a first embodiment of the invention, FIG. 2 a schematic circuit diagram of a display device having a diagnostic circuit according to a second embodiment of the invention, FIG. 3 schematic depictions of the content of the graphics memory and the display of the screen of the display device, and FIG. 4 a schematic circuit diagram of a display device having a diagnostic circuit according to a third embodiment of the invention.

FIG. 1 shows a display device 1 having a graphics memory 2 and a display or screen 3, which is supplied with electrical current I via a supply line 4. Furthermore, display device 1 is connected to a ground wire 5, via which electrical current I is carried away. Screen 3 includes a plurality of light-emitting diodes 18 that form pixels of screen 2. In the case of a monochromatic monitor, one light-emitting diode 18, for example, corresponds to one pixel. In a color monitor, each pixel can include a plurality—three in particular—of light-emitting diodes 18 that preferably radiate light of different wavelengths.

A shunt 6 is connected into the supply line 4; a voltage U drops across shunt 6 and is measured using a measuring device 7. Since voltage U that drops across shunt 6 is proportional to the flowing current I, the shunt 6 and the measuring device 7 in combination form a current-measuring device that sends a measured value 15 that characterizes the flowing current I to an evaluation device 8 that is electrically connected to measurement device 7. Evaluation device 8 compares measured value 15 to a reference value 16 that is determined on the basis of image data 14 that are stored in graphics memory 2 and are supplied to evaluation device 8. If measured value 15 and reference value 16 match within specified tolerances, then display device 1 is functioning properly. The current-measuring device and evaluation device 8, in combination, therefore form a diagnostic circuit for display device 1, wherein information about the state of display device 1 is emitted e.g. as state signal 17.

Figure 2:
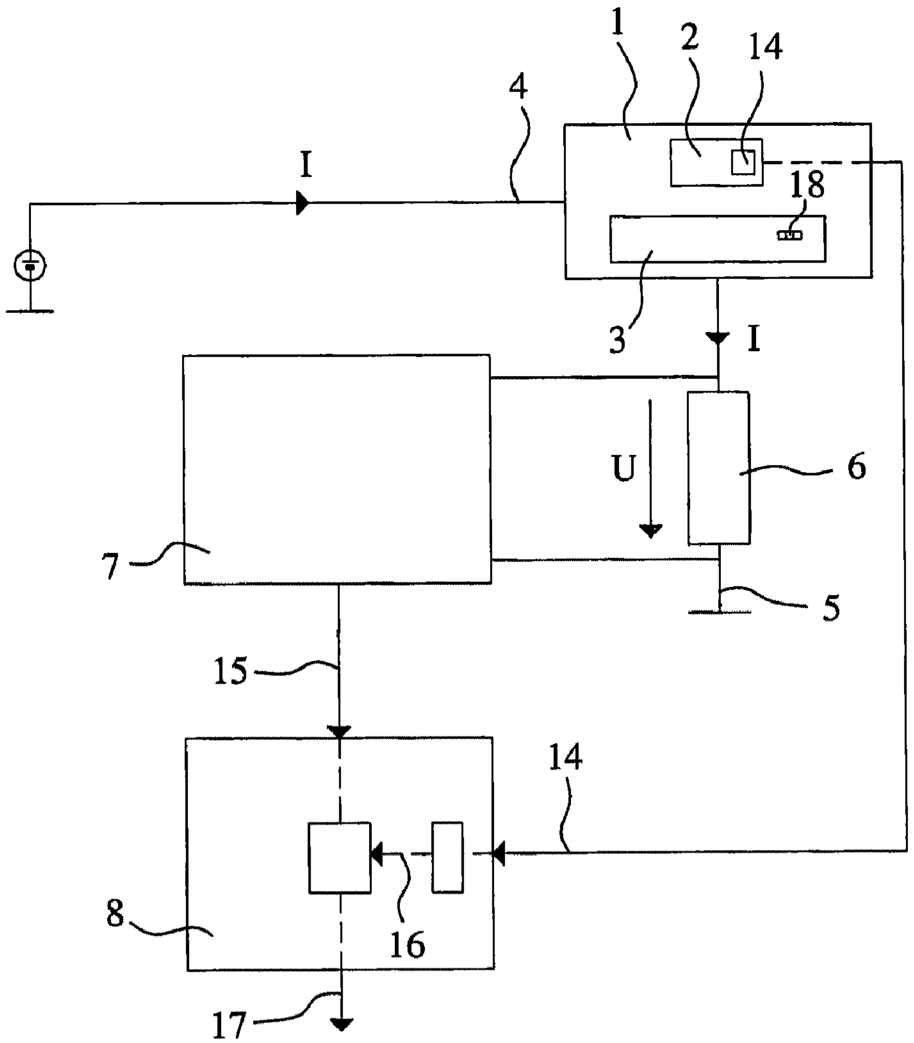

FIG. 2 shows a display device 1 having a diagnostic circuit according to a second embodiment of the invention, wherein features that are identical or similar to those of the first embodiment are labelled using the same reference numerals as in the first embodiment. The second embodiment differs only in that shunt 6 is connected in ground wire 5. Reference is made to the description of the first embodiment for the further description of the second embodiment.

Figure 4:
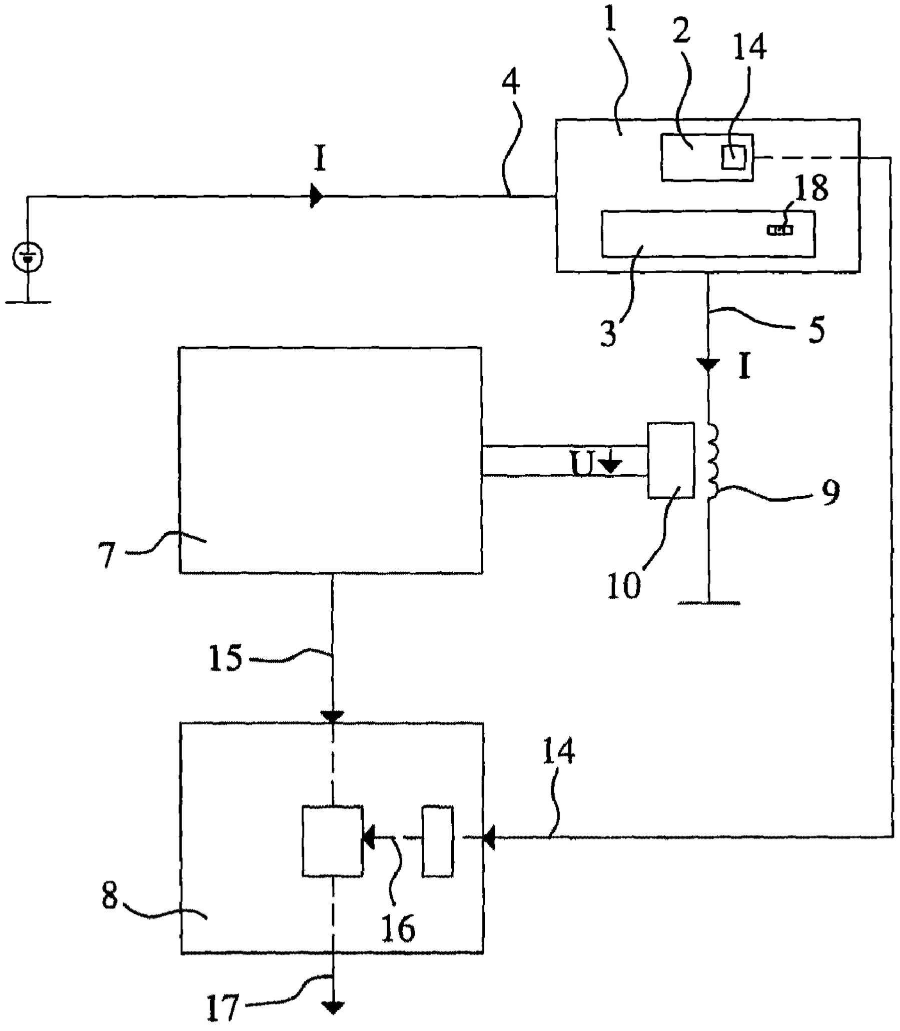

FIG. 4 shows a display device 1 having a diagnostic circuit according to a third embodiment of the invention, wherein features that are identical or similar to those of the previous embodiments are labelled using the same reference numerals as in the previous embodiments. The third embodiment differs from the second embodiment, in particular, in that inductance 9 (e.g. an electrical coil) instead of the shunt is connected in ground wire 5. As an alternative, inductance 9 could be connected in supply line 4. Current-carrying inductance 9 generates a magnetic field that is detected using a Hall element 10 which, depending on the magnetic field, transmits a voltage U to measurement device 7 that, in combination with Hall element 10 and inductance 9, forms a current-measuring device. Reference is made to the description of the previous embodiments for the further description of the third embodiment.

Figure 3:
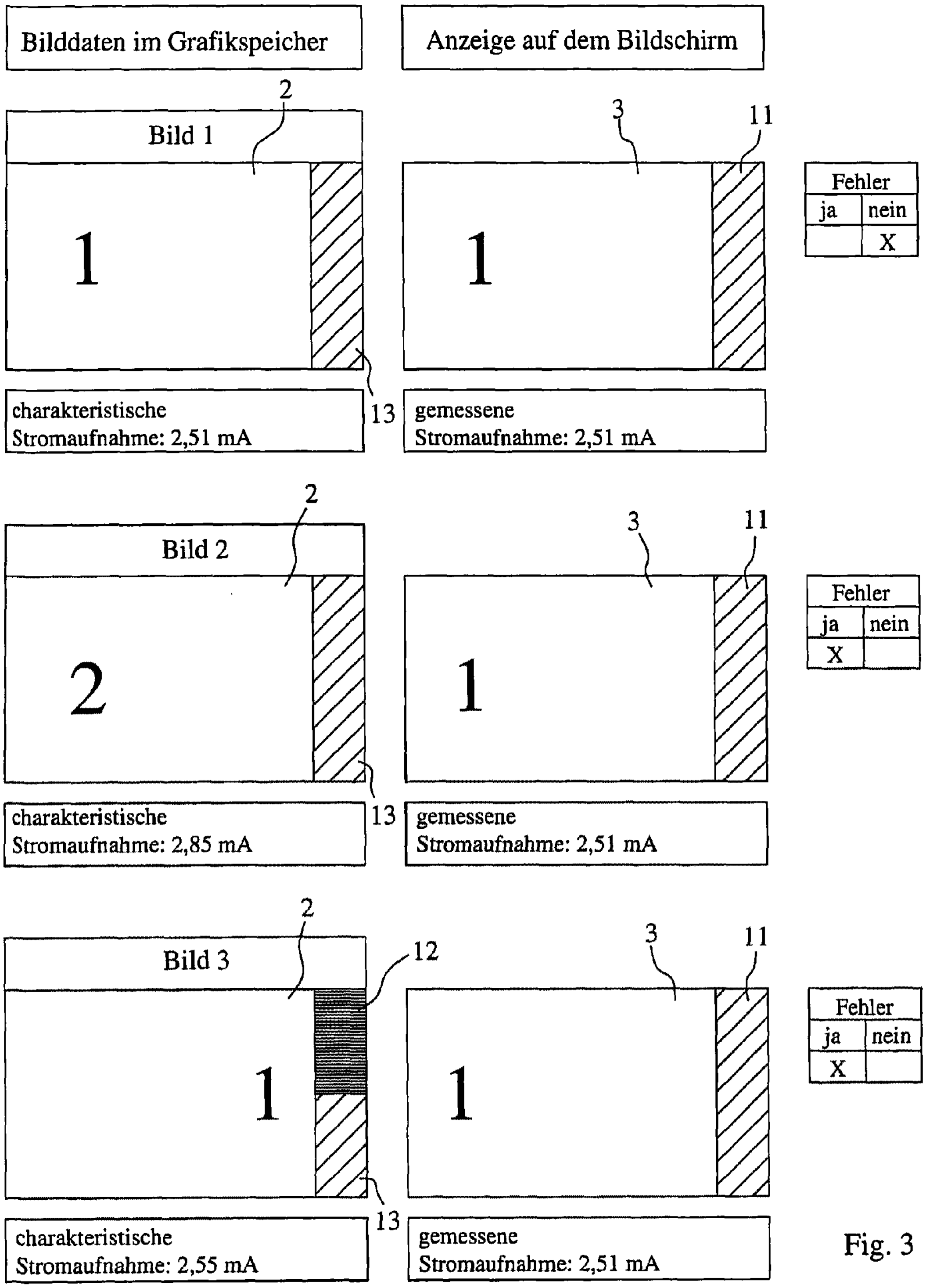

FIG. 3 shows an illustration of the diagnosis, wherein the first column indicates the contents of graphics memory 2, the second column indicates the display on screen 3, and the third column indicates an evaluation as to whether a display error has occurred or not.

According to “Image 1”, image data for the numeral “1” are stored in graphics memory 2. These image data result via computation in a characteristic current consumption of the display device of 2.51 mA. The current consumption that is measured is likewise 2.51 mA, and therefore the contents of the graphics memory are displayed correctly on screen 3. An error is not present. In this case, the two current-consumption values match. In practical applications, the measured value can also deviate from the computed value. Preferably, an error is not present despite such a deviation if it lies within certain tolerances.

According to “Image 2”, image data for the numeral “2” are stored in graphics memory 2. These image data result via computation in a characteristic current consumption of 2.85 mA. However, the current consumption that is measured is only 2.51 mA, and therefore the display is faulty. As shown in FIG. 3, the numeral “1” according to “Image 1” is displayed on the screen.

According to “Image 3”, the image data on the numeral “1” are stored in the graphics memory, but this numeral should be displayed in a different place on the screen as in “Image 1”. Since the numeral “1” as shown in “Image 3” would result in the same current consumption as the numeral “1” in “Image 1”, according to “Image 3”, an auxiliary pattern 12 is loaded in a region 13 of graphics memory 2. Region 13 is assigned to a concealed region 11 of screen 3, and so auxiliary pattern 12 is not visible to an observer. Nevertheless, auxiliary pattern 12 influences the current consumption which should be computed to be 2.55 mA according to “Image 3”.

However, the current consumption that is measured amounts to only 2.51 mA, and therefore the display is faulty. As shown in FIG. 3, the numeral “1” according to “Image 1” is displayed on the screen.

List of Reference Numerals

1. Display device
2. Graphics memory
3. Screen
4. Supply line
5. Ground wire
6. Shunt
7. Measuring device
8. Evaluation device
9. Inductance
10. Hall element
11. Concealed region of the screen
12. Auxiliary pattern
13. Memory region of the graphics memory
14. Image data
15. Measured value
16. Reference value
17. Additional signal
18. Light-emitting diode

The invention claimed is:

1. A method of diagnosing an electronic display device (1) having a screen (3) and a graphics memory (2) in which image data (14), either a displayed image or an image to be displayed on the screen (3), being one of stored and changed, the method comprising the steps of:

switching on a certain number of pixels of a concealed region (11) of the screen (3);

measuring a value to yield a measured value (15) characterizing either current consumption or change in current consumption of either the screen (3) or the display device (1);

determining, on a basis of either the image data (14) or a change in the image data (14), a reference value (16) characterizing one of the current consumption and the change in current consumption of either the screen (3) or the display device (1); and comparing the reference value (16) to the measured value (15).

2. The method according to claim 1, further comprising the step of measuring the current consumption or the change in current consumption using one of a shunt (6) and an inductance (9), and detecting a magnetic field using a magnetic field-sensitive sensor (10) with the magnetic field being proportional to the current consumption.

3. The method according to claim 1, further comprising the step of switching a source of current for the display device (1) between a ground wire (5) and a supply line (4), such that measurement of at least one of the current consumption and the change in current consumption occurs in at least one of the supply line (4) and the ground wire (5).

4. The method according to claim 1, further comprising the step of assigning at least first and second image segments to a character to be displayed by the screen (3) and a first image segment forms the image, and the image data being stored in the graphics memory.

5. The method according to claim 1, further comprising the step of utilizing an electronic display device (1) comprising light-emitting diodes (18).

6. The method according to claim 1, further comprising the step of generating a state signal (17) depending on a comparison of the reference value (16) with the measured value (15).

7. The method according to claim 1, further comprising the step of consuming a different amount of current via each different character displayed by the screen (3).

8. The method according to claim 1, further comprising the step of one of diagnosing and checking a display device, for a selector lever of an automobile, based on a comparison of the reference value (16) to the measured value (15).

9. The method according to claim 1, further comprising the step of using a shunt (6) for measuring either the current consumption or the change in current consumption.

10. The method according to claim 1, further comprising the step of loading a character to be displayed by the screen (3) via a plurality of steps.

11. The method according to claim 10, further comprising the step of determining current difference that occurs when switching from one step to another step.

12. The method according to claim 1, further comprising the step of determining a number of the certain number of pixels in the concealed region (11) of the screen (3) to be dependent on a size of the screen (3) in pixels and on a resolution of a measurement system in bits.

13. A device for diagnosing an electronic display device (1), the device comprising:

the electronic display device (1) having a screen (3) and a graphics memory (2) in which image data (14) of at least one of a displayed image and an image to be displayed on the display device (1), being one of stored and changed;

a concealed region (11) of the screen (3) having a certain number of pixels may be switched on or off;

a current-measuring device (6, 7) for measuring a value to yield a measured value (15) characterizing at least one of a current consumption and a change in a current consumption of at least one of the screen (3) and display device (1); and an evaluation device (8) for determining a reference value (16) characterizing at least one of the current consumption and the change in a current consumption of at least one of the screen (3) and the display device (1) on a basis of the image data (14) or the change in the image data (14), and comparison of the reference value (16) to the measured value (15).

14. A method of diagnosing an electronic display device (1) having a screen (3) and a graphics memory (2) for storing image data (14) of at least one of a displayed image and an image to be displayed on the screen (3), the method comprising the steps of:

measuring a value to yield a measured value (15) of at least one of a current consumption and a change in current consumption of at least one of the screen (3) and the display device (1);

determining a reference value (16) of at least one of the current consumption and the change in the current consumption of at least one of the screen (3) and display device (1) from one of the image data (14) and a change in the image data (14);

comparing the reference value (16) to the measured value (15);

recognizing an error in the electronic display device (1) if the measured value (15) is outside a range of the reference value (16); and distinguishing between a first and a second characters to be displayed by the screen (3) that result in an identical current by dividing the first and the second characters each into at least first and second image segments, each first image segment being selected such that their current consumption are substantially different from one another, each first image segment forming an image and an image data of each image being stored in the graphics memory (2);

comparing a reference value (16) for each first segment to a measured value (15) for each first segment;

loading the at least second image segments into the graphics memory (2); and entirely displaying the first and the second characters.

15. The method according to claim 14, further comprising the step of switching on a certain number of pixels of a concealed region (11) of the screen (3).

* * * * *